US011675728B2

(12) United States Patent
Leslie et al.

(10) Patent No.: US 11,675,728 B2
(45) Date of Patent: Jun. 13, 2023

(54) CONFIGURING MULTIPLE REGISTER CLOCK DRIVERS OF A MEMORY SUBSYSTEM

(71) Applicant: MICRON TECHNOLOGY, INC., Boise, ID (US)

(72) Inventors: Matthew B. Leslie, Boise, ID (US); Timothy M. Hollis, Boise, ID (US); Roy E. Greeff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 17/360,994

(22) Filed: Jun. 28, 2021

(65) Prior Publication Data

US 2022/0004517 A1   Jan. 6, 2022

Related U.S. Application Data

(60) Provisional application No. 63/047,439, filed on Jul. 2, 2020.

(51) Int. Cl.
*G06F 13/42*     (2006.01)
*G06F 13/16*     (2006.01)
*G11C 8/06*      (2006.01)
*G06F 1/08*      (2006.01)
*G11C 8/18*      (2006.01)

(52) U.S. Cl.
CPC ............ *G06F 13/4234* (2013.01); *G06F 1/08* (2013.01); *G06F 13/1689* (2013.01); *G06F 13/4282* (2013.01); *G11C 8/06* (2013.01); *G11C 8/18* (2013.01)

(58) Field of Classification Search
CPC .... G06F 1/08; G06F 13/1689; G06F 13/4234; G06F 13/4282; G11C 9/06; G11C 9/18
See application file for complete search history.

(56) References Cited

U.S. PATENT DOCUMENTS

| | | | |
|---|---|---|---|
| 2007/0217559 A1* | 9/2007 | Stott | H04L 7/0008 375/355 |
| 2017/0287538 A1* | 10/2017 | Gonzalez | G11C 7/12 |
| 2018/0150369 A1* | 5/2018 | Kim | G06F 11/2094 |
| 2019/0026238 A1* | 1/2019 | Lendvay | G11C 11/4093 |
| 2019/0042497 A1* | 2/2019 | Bhaskar | G11C 7/1003 |
| 2020/0334221 A1* | 10/2020 | Prahlad | G06F 9/455 |

* cited by examiner

Primary Examiner — Eric T Oberly
(74) Attorney, Agent, or Firm — Dorsey & Whitney LLP

(57) ABSTRACT

Methods, systems, and apparatuses related to configured dual register clock driver (RCD) devices on a single memory subsystem using different configuration information are described. In some examples, configuration of the two RCD devices with different configuration information may include use of a serial data bus to receive and store first RCD configuration data, which is provided to both of the RCD devices to configure one or more parameters of each respective RCD device. One of the RCD devices may receive second configuration data via a command and address bus to independently update the one or more configuration parameters of one of the two RCD devices.

22 Claims, 7 Drawing Sheets

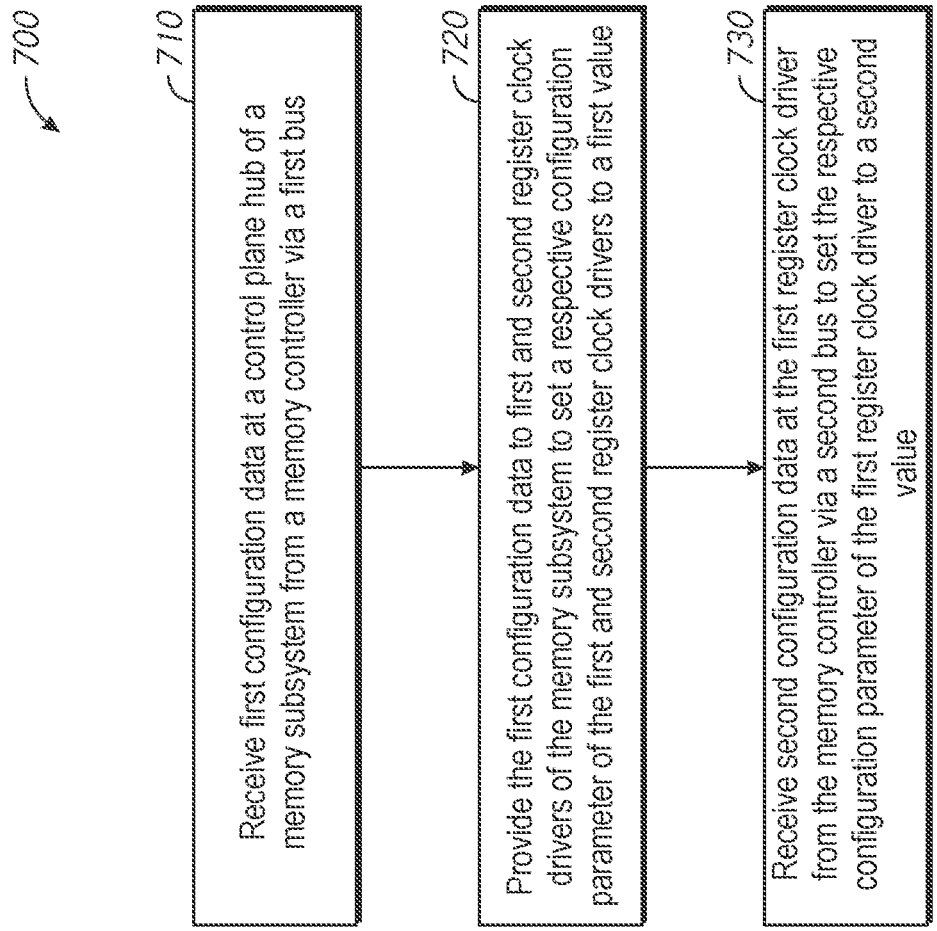

CONFIGURING MULTIPLE REGISTER CLOCK DRIVERS OF A MEMORY SUBSYSTEM

CROSS-REFERENCE TO RELATED APPLICATION

This application claims the filing benefit of U.S. Provisional Application No. 63/047,439, filed Jul. 2, 2020. This application is incorporated by reference herein in its entirety and for all purposes.

BACKGROUND

High data reliability, high speed of memory access, lower power consumption and reduced chip/package size are features that are demanded from semiconductor memory. In some memory module implementations, a number of supportable memory die may be limited by signaling drivers on the module. For example, subchannel driver circuitry of a register clock driver may only have a physical capacity to drive command and address bus information to a fixed number of memory devices of a memory module. In addition, existing memory module architectures only support a single register clock driver chip. Thus, a register clock driver circuit may limit a number of supportable memory devices, which may limit a size of a memory module.

BRIEF DESCRIPTION OF THE DRAWINGS

FIG. 7 is a flow diagram of a method for configuring dual register clock drivers of a memory subsystem according to an embodiment of the present disclosure.

DETAILED DESCRIPTION

Figure 1:
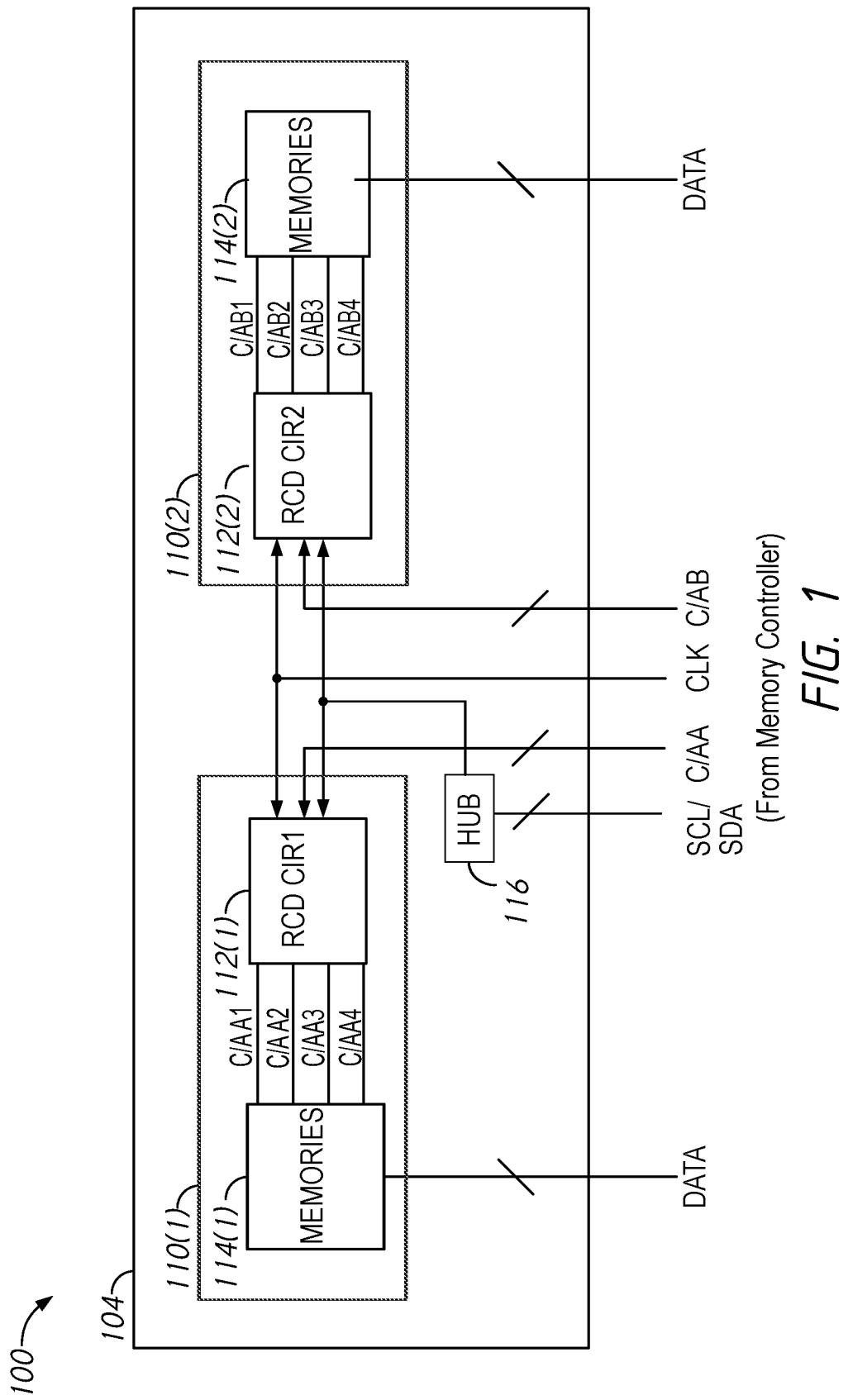
FIG. 1 is a block diagram of a memory system including a memory subsystem according to an embodiment of the present disclosure.

This disclosure describes methods, systems, and apparatuses for configuring dual register clock driver (RCD) devices on a single memory subsystem with different configuration information. Some memory device standards contemplate single RCD device memory subsystem architectures, along with corresponding configuration procedures for the single RCD device. In some examples based on these standards, configuration of two RCD devices with different configuration information may include use of a serial data bus (e.g., including a serial clock signal SCL and serial data signal SDA) to receive and store first RCD configuration data, which is provided to both of the RCD devices to configure one or more parameters of each respective RCD device. Subsequently, one of the RCD devices may receive second configuration data via a command and address bus to update the one or more configuration parameters of one of the two RCD devices. The serial data bus may include a SMBus or an I²C bus, in some examples. The one or more configuration parameters may be related to configuration of receiver components (e.g., coefficient(s) of a decision feedback equalizer (DFE)), configuration of transmitter components (e.g., coefficient(s) of a feed forward equalizer (FFE)), timing parameters, power levels, etc., or any combination thereof.

In some architectures, for a single channel, a memory controller (e.g., or host, central processor unit, one or more other processor units, etc.) may provide respective command and address (C/A) information over two independent subchannels (e.g., using different respective sets of C/A signal lines) in parallel, along with a single clock signal used to synchronize timing of the two subchannels such that the respective C/A information for each subchannel is provided to a respective group (e.g., a memory rank, a memory package, or some other grouping) of memories (e.g., die, devices, etc.) contemporaneously. Thus, in a two RCD device implementation, the clock signal may be split (e.g., via clock tee) such that the clock signal is provided to the two RCD devices contemporaneously to reduce likelihood of asynchronous timing between the two RCD devices. In an example, first and second RCD devices may be configured to provide first subchannel C/A information and second subchannel C/A information, respectively, to respective first and second group of memories of the memory subsystem. However, physical differences in the arrangement of each RCD device relative to the respective C/A bus and to the respective group of memories, as well as process differences within each RCD device or connected memories, may result in different configurations between the two RCD devices. Thus, to accommodate different configurations, both RCD devices may be configured according to first configuration data received via a serial data bus via a control plane hub (e.g., chip, device, circuit, etc.), and then a first one of the RCD devices may be configured according to second configuration data received in first subchannel C/A information received via a first C/A bus. As previously mentioned, an ability to independently configure more than one RCD device on a memory subsystem improve reliability of a dual RCD device memory subsystem architecture.

FIG. 1 is a block diagram of a memory system 100 including a memory subsystem 104 according to an embodiment of the present disclosure. The memory subsystem 104 may be coupled to serial data bus SCL/SDA, C/A A bus, C/A B bus, and a clock bus providing a clock signal CLK to receive command and address information form a memory controller (e.g., or a host, central processor unit, one or more other processor units or controllers, a DRAM controller, etc.) (not shown) of the memory system 100. The memory subsystem 104 may include a control plane hub 116, a memory package 110(1), and a memory package 110(2). The memory subsystem 104 may include a memory module, such as a dual, inline memory module (DIMM) (e.g., a registered DIMM, a load reduction DIMM (LRDIMM), a micro DIMM, non-volatile DIMM (NVDIMM) (e.g., including non-volatile memory and a controller (not shown)), or any other type of DIMM). In some examples, the memory subsystem 104 may include a soldered memory subsystem other than a memory module and/or a DIMM.

The control plane hub 116 is configured to receive and store configuration data from the memory controller via the SCL/SDA bus and to provide control plane communication to facilitate provision of the configuration data to components of the memory subsystem 104 and/or one or both of the memory package 110(1) and the memory package 110(2). The SCL/SDA bus may include a SMBus or an I²C bus, in some examples. The configuration data may include configuration data pertaining to operation of the memory subsystem 104 and operation of the memory packages 110(1) and 110(2), such as timing parameters, addressing parameters, power levels, receiver and transmitter component coefficients, etc., or any combination thereof. The control plane hub 116 may provide the configuration data to the memory packages 110(1) and 110(2) during operation. The control plane hub 116 may include a chip, device, circuit, etc. In some examples, the control plane hub 116 may include an electrically-erasable programmable read-only memory (EEPROM) configured to store the configuration data, in some examples.

The memory package 110(1) may include a register clock driver circuit 112(1) coupled to memories 114(1) and the memory package 110(2) may include a register clock driver circuit 112(2) coupled to memories 114(2). The register clock driver circuit 112(1) and the register clock driver circuit 112(2) may be configured to receive configuration data from the control plane hub 116 to set one or more configurable parameters for operation. The one or more configurable parameters may include timing parameters, power levels, addressing parameters, receiver and transmitter component coefficients (e.g., DFE or FFE coefficients), etc., or any combination thereof.

The register clock driver circuit 112(1) may also be configured to receive first subchannel C/A information from the C/A A bus and the CLK signal and the register clock driver circuit 112(2) may also be configured to receive second subchannel C/A information from the C/A B bus and the CLK signal. The first and second subchannel C/A information may correspond to C/A information for a single channel. The first subchannel C/A information and the second subchannel C/A information may include memory access commands and addresses, chip select signals, etc., corresponding to first and second subchannels, respectively. The register clock driver circuit 112(1) may provide the first subchannel C/A information to each of C/A A1-A4 buses in parallel responsive to the CLK signal and the register clock driver circuit 112(2) may provide the second subchannel C/A information to each of C/A B1-B4 buses in parallel responsive to the CLK signal.

In some examples, the first subchannel C/A information may also include information to configure components of the memory package 110(1). For example, the first subchannel C/A information may include second configuration data to set the one or more configurable parameters of the register clock driver circuit 112(1).

Each memory of the memories 114(1) may be coupled to a respective one of C/A A1-A4 buses to receive first subchannel C/A information and each memory of the memories 114(2) may be coupled to a respective one of C/A B1-B4 buses to receive second subchannel C/A information. Each memory of the memories 114(1) may also be coupled to a respective data bus to receive write data from and to provide read data to the memory controller responsive to the first subchannel C/A information. Additionally, each memory of the memories 114(2) may be coupled to a respective data bus to receive write data from and to provide read data to the memory controller responsive to the second subchannel C/A information. The memories 114(1) and/or the memories 114(2) may each include one or more memory devices, packages, and/or memory die. In some examples, the one or more memory devices or packages may each include one or more memory die stacks. The memories 114(1) and/or the memories 114(2) may each include dynamic, random-access memory (DRAM) (e.g., double data rate (DDR) 4 DRAM, DDR5 DRAM, DDR6 DRAM, etc.), in some examples.

In operation, for a given communication channel, a memory controller of the memory system 100 may contemporaneously provide respective first and second subchannel C/A information over two independent subchannels via the C/A A bus and C/A B bus, respectively, along with a single clock signal used to synchronize timing of the two subchannels to the memory subsystem 104.

In some examples, the memory subsystem 104 may further include the control plane hub 116 that is configured to receive and store configuration data from the memory controller via the SCL/SDA bus and to provide control plane communication to facilitate provision of the configuration data to components (e.g., thermal sensors, power management integrated circuits, etc.) of the memory subsystem 104 and/or one or both of the memory package 110(1) and the memory package 110(2). The configuration data may include configuration data pertaining to operation of the memory subsystem 104 and operation of the memory packages 110(1) and 110(2), such as timing parameters, addressing parameters, receiver and transmitter component coefficients, modes of operation, etc., or any combination thereof. The control plane hub 116 may provide the configuration data may be to the memory packages 110(1) and 110(2) during operation and/or during initialization.

Specifically, the control plane hub 116 may be configured to provide at least some of the configuration data to the register clock driver circuit 112(1) and the register clock driver circuit 112(2) contemporaneously. The configuration data may be used to configure one or more parameters of the register clock driver circuit 112(1) and the register clock driver circuit 112(2), such as timing parameters, addressing parameters, receiver and transmitter component coefficients, modes of operation, etc., or any combination thereof. In some examples, the configuration data may be the same configuration data from the control plane hub 116. However, physical differences in the arrangement of each of the register clock driver circuit 112(1) and the register clock driver circuit 112(2) relative to the respective C/A A or B bus and to the respective memories 114(1) or 114(2), as well as process differences within each of the register clock driver circuit 112(1) and the register clock driver circuit 112(2) or the connected memories 114(1) and 114(2), may result in different configurations between the register clock driver circuit 112(1) and the register clock driver circuit 112(2). Thus, to accommodate different configurations, the register clock driver circuit 112(1) may be configured to receive second configuration data via the first subchannel C/A information, and may update the one or more parameters of the register clock driver circuit 112(1) based on the second configuration data.

The memory package 110(1) is configured to receive and respond to the first subchannel C/A information to receive and store write data at and provide read data from the memories 114(1) to the memory controller via the respective data bus and the memory package 110(2) is configured to receive and respond to the second subchannel C/A information to receive and store write data at and provide read data from the memories 114(2) to the memory controller via the respective data bus.

The register clock driver circuit 112(1) and the register clock driver circuit 112(2) may each be configured to drive the first and second subchannel C/A information received from the C/A A bus and the C/A B bus, respectively, to the C/A A1-A4 buses and the C/A B1-B4 buses, respectively, responsive to the CLK signal. The CLK signal may be split (e.g., via clock tee) such that is routed to and received at the register clock driver circuit 112(1) and the register clock driver circuit 112(2) contemporaneously. The clock tee may be arranged (e.g., impedance matched, trace length and shape, etc.) to reduce likelihood of timing differences the register clock driver circuit 112(1) and the register clock driver circuit 112(2). Each of the register clock driver circuit 112(1) and the register clock driver circuit 112(2) may include dual (e.g., A and B), independent subchannel driver circuits that are each configured to drive the respective subchannel C/A information to a respective two of the C/A A1-A4 buses or a respective two of the C/A B1-B4 buses. For example, in response to the CLK signal, the first subchannel driver circuit of the register clock driver circuit 112(1) may provide the first subchannel C/A information to the C/A A1-A2 buses and the second subchannel driver circuit of the register clock driver circuit 112(1) may provide the first subchannel C/A information to the C/A A3-A4 buses. The subchannel driver circuits of the register clock driver circuit 112(2) may each similarly provide the second subchannel C/A information to a respective two of the C/A B1-B4 buses responsive to the CLK signal.

The memories 114(1) may be divided into four subsets, with the memories of each subset coupled to an individual one of the C/A A1-A4 buses to receive the first subchannel C/A information. Similarly, the memories 114(2) may be divided into four subsets, with the memories of each subset coupled to an individual one of the C/A B1-B4 buses to receive the second subchannel C/A information. One or more of the memories 114(1) may receive write data from or provide read data to the memory controller via the respective data bus, as well as perform other operations, responsive to the first subchannel C/A information. Similarly, one or more of the memories 114(2) may receive write data from or provide read data to the memory controller via the respective data bus, as well as perform other operations, responsive to the second subchannel C/A information.

It is appreciated that, without departing from the scope of the disclosure, the memory subsystem 104 could be scaled to include more than two memory packages, more than two RCD circuits, and/or more than two groups of memories, such as to support additional subchannels. It is also appreciated that each of the register clock driver circuit 112(1) and the register clock driver circuit 112(2) may be configured with additional driver circuits to support more than four independent C/A buses. In some examples, the control plane hub 116 may be included in one of the memory packages 110(1) and 110(2) without departing from the scope of the disclosure. In addition, rather than a single one of the control plane hub 116 on the memory subsystem 104, each of the memory packages 110(1) and 110(2) may include a respective control plane hub that is programmed contemporaneously with the common data from the SCL/SDA bus without departing from the scope of the disclosure. An ability to support more than one RCD circuit on the memory subsystem 104 may increase a number of output drivers, which may, correspondingly provide support for an increased number of memories on the memory subsystem 104 as compared with single RCD device memory subsystem implementations.

Figure 2:
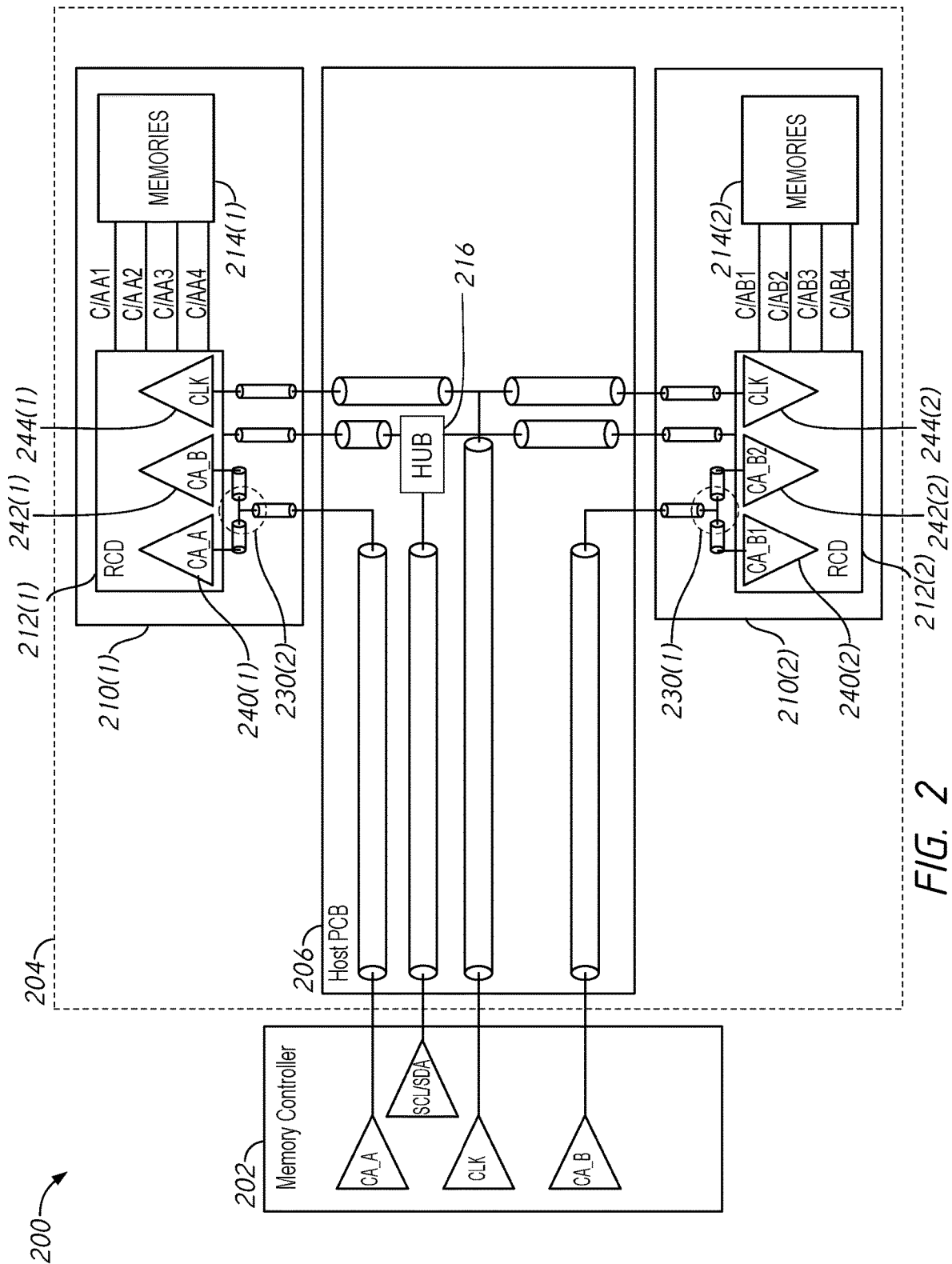
FIG. 2 is a block diagram of a memory system including a memory subsystem coupled to a memory controller according to an embodiment of the present disclosure.

FIG. 2 is a block diagram of a memory system 200 including a memory subsystem 204 coupled to a memory controller 202 according to an embodiment of the present disclosure. The memory subsystem 204 may be coupled to C/A A bus, C/A B bus, and a clock signal CLK driven by the memory controller 202. The memory controller 202 may include a host, central processor unit, one or more other processor units or controllers, a DRAM controller, etc. The memory subsystem 204 may include a printed circuit board 205 with traces to support signal lines for the C/A A bus, the C/A B bus, and the CLK signal, and may include infrastructure to support installation of a memory package 210(1), a memory package 210(2), and/or a control plane hub 216. In some examples, the printed circuit board 205 may include a memory module printed circuit board, such as a DIMM printed circuit board. In other examples, the printed circuit board 205 includes a motherboard printed circuit board, or any other type of printed circuit board. In some examples, the memory subsystem 204 may include memory module, such as a DIMM (e.g., including a registered DIMM, a LRDIMM, a micro DIMM, a NVDIMM, or any other type of DIMM). In some examples, the memory subsystem 204 may include a soldered memory subsystem other than a memory module and/or a DIMM. The memory subsystem 104 of FIG. 1 may implement the memory subsystem 204, in some examples.

The control plane hub 216 is configured to receive and store configuration data from the memory controller 202 via the SCL/SDA bus and to provide control plane communication to facilitate provision of the configuration data to components of the memory subsystem 204 and/or one or both of the memory package 210(1) and the memory package 210(2). The SCL/SDA bus may include a SMBus or an $I^2C$ bus, in some examples. The configuration data may include configuration data pertaining to operation of the memory subsystem 204 and operation of the memory packages 210(1) and 210(2), such as timing parameters, addressing parameters, power levels, receiver and transmitter component coefficients, etc., or any combination thereof. The control plane hub 216 may provide the configuration data to the memory packages 210(1) and 210(2) during operation. The control plane hub 216 may include a chip, device, circuit, etc. In some examples, the control plane hub 216 may include an electrically-erasable programmable read-only memory (EEPROM) configured to store the configuration data, in some examples.

The memory package 210(1) may include a register clock driver circuit 212(1) coupled to memories 214(1) and the memory package 210(2) may include a register clock driver circuit 212(2) coupled to memories 214(2)). The register clock driver circuit 212(1) and the register clock driver circuit 212(2) may be configured to receive configuration data from the control plane hub 216 to set one or more configurable parameters for operation. The one or more configurable parameters may include timing parameters, power levels, addressing parameters, receiver and transmitter component coefficients (e.g., DFE or FFE coefficients), etc., or any combination thereof.

The register clock driver circuit 212(1) may also be configured to receive first subchannel C/A information from the C/A A bus and the CLK signal and the register clock driver circuit 212(2) may also be configured to receive second subchannel C/A information from the C/A B bus and the CLK signal. The first and second subchannel C/A information may correspond to C/A information for a single channel. The first subchannel C/A information and the second subchannel C/A information may include memory access commands and addresses, chip select signals, etc., corresponding to first and second subchannels, respectively. The first and/or second subchannel C/A information may also include information to configure the memory subsystem 204 and/or components of the memory package 210(1) and/or the memory package 210(2). The register clock driver circuit 212(1) may provide the first subchannel C/A information to each of C/A A1-A4 buses in parallel (e.g., contemporaneously) responsive to the CLK signal and the register clock driver circuit 212(2) may provide the second subchannel C/A information to each of C/A B1-B4 buses in parallel responsive to the CLK signal.

The register clock driver circuit 212(1) may include a first driver circuit 240(1) and a second driver circuit 242(1) that are each configured to receive the first subchannel C/A information in parallel (e.g., contemporaneously) from the C/A A bus via a 232(1) and a clock driver circuit 244(1) configured to receive the CLK signal. Responsive to the CLK signal driven from the clock driver circuit 244(1), the first driver circuit 240(1) may be configured to drive the first subchannel C/A information to the C/A A1-A2 buses and the second driver circuit 242(1) may be configured to drive the first subchannel C/A information to the C/A A3-A4 buses.

In some examples, the first subchannel C/A information may also include information to configure components of the memory package 210(1). For example, the first subchannel C/A information may include second configuration data to set the one or more configurable parameters of the register clock driver circuit 212(1).

Similarly, the register clock driver circuit 212(2) may include a first driver circuit 240(2) and a second driver circuit 242(2) that are each configured to receive the second subchannel C/A information in parallel (e.g., contemporaneously) from the C/A B bus via a 232(2) and a clock driver circuit 244(2) configured to receive the CLK signal. Responsive to the CLK signal driven from the clock driver circuit 244(1), the first driver circuit 240(1) may be configured to drive the second subchannel C/A information to the C/A B1-B2 buses and the second driver circuit 242(1) may be configured to drive the second subchannel C/A information to the C/A B3-B4 buses.

Each memory of the memories 214(1) may be coupled to a respective one of C/A A1-A4 buses to receive first subchannel C/A information and each memory of the memories 214(2) may be coupled to a respective one of C/A B1-B4 buses to receive second subchannel C/A information. Each memory of the memories 214(1) may also be coupled to a respective data bus to receive write data from and to provide read data to the memory controller responsive to the first subchannel C/A information. Additionally, each memory of the memories 214(2) may be coupled to a respective data bus to receive write data from and to provide read data to the memory controller responsive to the second subchannel C/A information. The memories 214(1) and/or the memories 214(2) may each include one or more memory devices, packages, and/or memory die. In some examples, the one or more memory devices or packages may each include one or more memory die stacks. The memories 214(1) and/or the memories 214(2) may each include dynamic, random-access memory (DRAM) (e.g., double data rate (DDR) 4 DRAM, DDR5 DRAM, DDR6 DRAM, etc.), in some examples.

In operation, for a given communication channel, C/A A and C/A B drivers of the memory controller 202 may contemporaneously provide respective first and second subchannel C/A information over two independent subchannels via the C/A A bus and C/A B bus, respectively, along with a CLK driver to provide a single clock signal over a clock signal line that is used to synchronize timing of the two subchannels to the memory subsystem 204.

In some examples, the memory subsystem 204 may further include the control plane hub 216 that is configured to receive and store configuration data from the memory controller 202 via the SCL/SDA bus and to provide control plane communication to facilitate provision of the configuration data to components (e.g., thermal sensors, power management integrated circuits, etc.) of the memory subsystem 204 and/or one or both of the memory package 210(1) and the memory package 210(2). The configuration data may include configuration data pertaining to operation of the memory subsystem 204 and operation of the memory packages 210(1) and 210(2), such as timing parameters, addressing parameters, receiver and transmitter component coefficients, modes of operation, etc., or any combination thereof. The control plane hub 216 may provide the configuration data may be to the memory packages 210(1) and 210(2) during operation and/or during initialization.

Specifically, the control plane hub 216 may be configured to provide at least some of the configuration data to the register clock driver circuit 212(1) and the register clock driver circuit 212(2) contemporaneously. The configuration data may be used to configure one or more parameters of the register clock driver circuit 212(1) and the register clock driver circuit 212(2), such as timing parameters, addressing parameters, receiver and transmitter component coefficients, modes of operation, etc., or any combination thereof. In some examples, the configuration data may be the same configuration data from the control plane hub 216. However, physical differences in the arrangement of each of the register clock driver circuit 212(1) and the register clock driver circuit 212(2) relative to the respective C/A A or B bus and to the respective memories 214(1) or 214(2), as well as process differences within each of the register clock driver circuit 212(1) and the register clock driver circuit 212(2) or the connected memories 214(1) and 214(2), may result in different configurations between the register clock driver circuit 212(1) and the register clock driver circuit 212(2). Thus, to accommodate different configurations, the register clock driver circuit 212(1) may be configured to receive second configuration data via the first subchannel C/A information, and may update the one or more parameters of the register clock driver circuit 212(1) based on the second configuration data.

The memory package 210(1) is configured to receive and respond to the first subchannel C/A information to receive and store write data at and provide read data from the memories 214(1) to the memory controller via the respective data bus and the memory package 210(2) is configured to receive and respond to the second subchannel C/A information to receive and store write data at and provide read data from the memories 214(2) to the memory controller via the respective data bus.

The register clock driver circuit 212(1) and the register clock driver circuit 212(2) may each be configured to drive the first and second subchannel C/A information received from the C/A A bus and the C/A B bus, respectively, to the C/A A1-A4 buses and the C/A B1-B4 buses, respectively, responsive to the CLK signal. The CLK signal may be split (e.g., via clock tee) such that is routed to and received at the register clock driver circuit 212(1) and the register clock driver circuit 212(2) contemporaneously. The clock tee may be arranged (e.g., impedance matched, trace length and shape, etc.) to reduce likelihood of timing differences the register clock driver circuit 212(1) and the register clock driver circuit 212(2).

The first driver circuit 240(1) and the second driver circuit 242(1) of the register clock driver circuit 212(1) may each receive the first subchannel C/A information in parallel (e.g., contemporaneously) from the C/A A bus and the clock driver circuit 244(1) may receive the CLK signal. The C/A A bus may be split via a tee 230(1) to provide the first subchannel C/A information to each of the first driver circuit 240(1) and the second driver circuit 242(1). Responsive to the CLK signal driven from the clock driver circuit 244(1), the first driver circuit 240(1) may drive the first subchannel C/A information to the C/A A1-A2 buses and the second driver circuit 242(1) may drive the first subchannel C/A information to the C/A A3-A4 buses.

The first driver circuit 240(2) and the second driver circuit 242(2) of the register clock driver circuit 212(2) may receive the second subchannel C/A information in parallel (e.g., contemporaneously) from the C/A B bus and the clock driver circuit 244(2) may receive the CLK signal. The C/A B bus may be split via a tee 230(2) to provide the first subchannel C/A information to each of the first driver circuit 240(2) and the second driver circuit 242(2). Responsive to the CLK signal driven from the clock driver circuit 244(1), the first driver circuit 240(1) may drive the second subchannel C/A information to the C/A B1-B2 buses and the second driver circuit 242(1) may drive the second subchannel C/A information to the C/A B3-B4 buses. The second driver circuit 242(1), the clock driver circuit 244(1), the second driver circuit 242(2), and the clock driver circuit 244(2) may all operation in a synchronized manner with timing based on the common CLK signal.

The memories 214(1) may be divided into four subsets, with the memories of each subset coupled to an individual one of the C/A A1-A4 buses to receive the first subchannel C/A information. Similarly, the memories 214(2) may be divided into four subsets, with the memories of each subset coupled to an individual one of the C/A B1-B4 buses to receive the second subchannel C/A information. One or more of the memories 214(1) may receive write data from or provide read data to the memory controller via the respective data bus, as well as perform other operations, responsive to the first subchannel C/A information. Similarly, one or more of the memories 214(2) may receive write data from or provide read data to the memory controller via the respective data bus, as well as perform other operations, responsive to the second subchannel C/A information.

It is appreciated that, without departing from the scope of the disclosure, the memory subsystem 204 could be scaled to include more than two memory packages, more than two RCD circuits, and/or more than two groups of memories, such as to support additional subchannels. It is also appreciated that each of the register clock driver circuit 212(1) and the register clock driver circuit 212(2) may be configured with additional driver circuits to support more than four independent C/A buses. In some examples, the control plane hub 216 may be included in one of the memory packages 210(1) and 210(2), rather than on the printed circuit board 206, without departing from the scope of the disclosure. In addition, rather than a single one of the control plane hub 216 on the memory subsystem 204, each of the memory packages 210(1) and 210(2) may include a respective control plane hub that is programmed contemporaneously with the common data from the SCL/SDA bus without departing from the scope of the disclosure. An ability to support more than one RCD circuit on the memory subsystem 204 may increase a number of output drivers, which may, correspondingly provide support for an increased number of memories on the memory subsystem 204 as compared with single RCD device memory subsystem implementations.

Figures 3A, 3B:
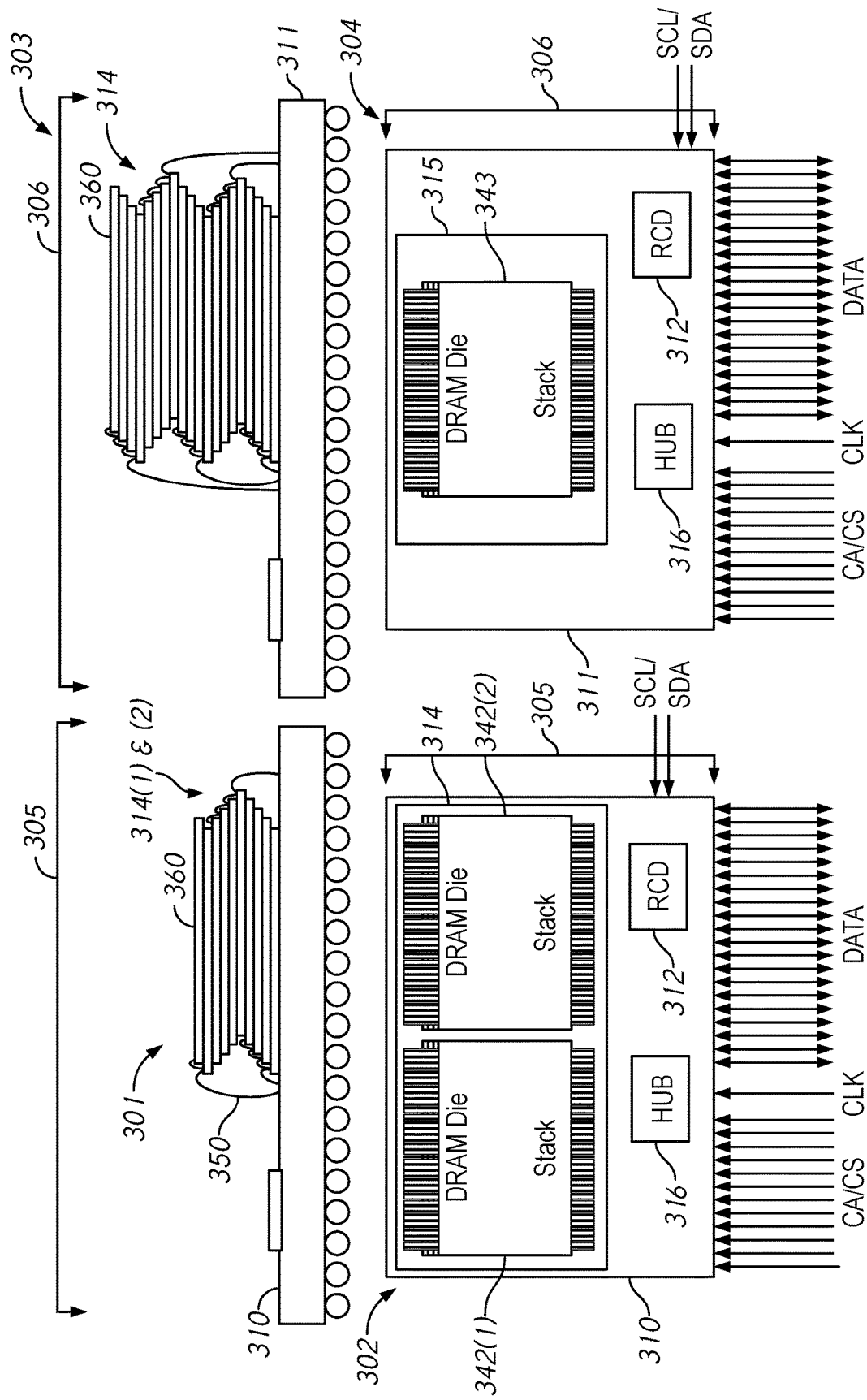
FIGS. 3A and 3B are block diagrams of a two-stack memory package and a single-stack memory package, respectively, in accordance with embodiments of the disclosure.

FIGS. 3A and 3B are block diagrams of a dual-stack memory package 310 and a single-stack memory package 311, respectively, in accordance with embodiments of the disclosure. The memory package 110(1) and/or the memory package 110(2) of FIG. 1 and/or the memory package 210(1) and/or the memory package 210(2) of FIG. 2 may implement the dual-stack memory package 310 and/or the single-stack memory package 311, in some examples.

FIG. 3A includes a side view 301 and a top (e.g., plan) view 302 of the dual-stack memory package 310. The side view 301 depicts the memory package 310 from the perspective of the side 305 (i.e., right side of the top view 302) of the memory package 310 in the FIG. 3A. The dual-stack memory package 310 may include register clock driver circuit 312, a memory 314, and a control plane hub 316. The register clock driver circuit 312 may be configured to perform operations as described with reference to the register clock driver circuit 112(1) or the register clock driver circuit 112(2) of FIG. 1 and/or the register clock driver circuit 212(1) or the register clock driver circuit 212(2) of FIG. 2. The dual-stack memory package 310 may be coupled to a C/A bus (e.g., one of the C/A A1-A4 buses or one of the C/A B1-B4 buses of FIGS. 1 and/or 2) to receive respective subchannel C/A information, to a clock signal line to receive the clock signal CLK (e.g., the CLK signal of FIGS. 1 and/or 2), and to a respective data bus to receive write data and to provide read data.

The memory 314 may include a die stack 342(1) and a die stack 342(2) that each include 10 of the memory die 360 stacked in a shingle or cascade stacked arrangement (e.g., each of the memory die 360 is offset horizontally from adjacent ones of the memory die 360). Each of the memory die 360 may include a DRAM architecture, such as DDR4 DRAM, DDR5 DRAM, DDR6 DRAM, etc.), in some examples. Each of the memory die 360 of the die stack 342(1) and the die stack 342(2) may be coupled to other circuitry to perform memory access operations via respective wire bonds 350. It is appreciated that the die stack 342(1) and the die stack 342(2) may include more or fewer than 10 of the memory die 360 without departing from the scope of the disclosure. It is also appreciated that the die stack 342(1) may include a different number of the memory die 360 than the die stack 342(2), in some examples. It is also appreciated that the die stack 342(1) and/or the die stack 342(2) may be arranged to use other stacking and connection implementations, such as a 3D through-silicon via stack, without departing from the scope of the disclosure.

The dual-stack memory package 310 may further include the control plane hub 316 that is configured to receive and store configuration data from the memory controller via a SCL/SDA bus and to provide control plane communication to facilitate provision of the configuration data to components of the dual-stack memory package 310. The configuration data may include configuration data pertaining to operation of the dual-stack memory package 310, such as timing parameters, addressing parameters, receiver and transmitter component coefficients, modes of operation, etc., or any combination thereof. The control plane hub 316 may provide the configuration data may be to the register clock driver circuit 312 and/or the memory 314 during operation and/or during initialization.

Specifically, the control plane hub 316 may be configured to provide at least some of the configuration data to the register clock driver circuit 312. The configuration data may be used to configure one or more parameters of the register clock driver circuit 312, such as timing parameters, addressing parameters, receiver and transmitter component coefficients, modes of operation, etc., or any combination thereof. In addition, the register clock driver circuit 312 may be configured to receive second configuration data via the first subchannel C/A information provided on the C/A bus, and may update the one or more parameters of the register clock driver circuit 312 based on the second configuration data. The control plane hub 316 may include a chip, device, circuit, etc. In some examples, the control plane hub 316 may include an electrically-erasable programmable read-only memory (EEPROM) configured to store the configuration data, in some examples.

FIG. 3B includes a side view 303 and a top (e.g., plan) view 304 of the single-stack memory package 311. The side view 303 depicts the memory package 311 from the perspective of the side 306 (i.e., right side of the top view 304) of the memory package 310 in the FIG. 3B. The single-stack memory package 311 may include register clock driver circuit 312 and a memory 315. The register clock driver circuit 312 may be configured to perform operations as described with reference to the register clock driver circuit 112(1) or the register clock driver circuit 112(2) of FIG. 1 and/or the register clock driver circuit 212(1) or the register clock driver circuit 212(2) of FIG. 2. The single-stack memory package 311 may be coupled to a C/A bus (e.g., one of the C/A A1-A4 buses or one of the C/A B1-B4 buses of FIGS. 1 and/or 2) to receive respective subchannel C/A information, to a clock signal line to receive the clock signal CLK (e.g., the CLK signal of FIGS. 1 and/or 2), and to a respective data bus to receive write data and to provide read data.

The memory 315 may include a die stack 343 that includes 20 of the memory die 360 stacked in a shingle or cascade stacked arrangement (e.g., each of the memory die 360 is offset horizontally from adjacent ones of the memory die 360). Each of the memory die 360 of the die stack 343 may be coupled to other circuitry to perform memory access operations via respective wire bonds 350. It is appreciated that the die stack 343 may include more or fewer than 20 of the memory die 360 without departing from the scope of the disclosure. It is also appreciated that the die stack 343 may be arranged to use other stacking and connection implementations, such as a 3D through-silicon via stack, without departing from the scope of the disclosure.

The single-stack memory package 311 may further include the control plane hub 316 that is configured to receive and store configuration data from the memory controller via a SCL/SDA bus and to provide control plane communication to facilitate provision of the configuration data to components of the single-stack memory package 311. The configuration data may include configuration data pertaining to operation of the single-stack memory package 311, such as timing parameters, addressing parameters, receiver and transmitter component coefficients, modes of operation, etc., or any combination thereof. The control plane hub 316 may provide the configuration data may be to the register clock driver circuit 312 and/or the memory 315 during operation and/or during initialization.

Specifically, the control plane hub 316 may be configured to provide at least some of the configuration data to the register clock driver circuit 312. The configuration data may be used to configure one or more parameters of the register clock driver circuit 312, such as timing parameters, addressing parameters, receiver and transmitter component coefficients, modes of operation, etc., or any combination thereof. In addition, the register clock driver circuit 312 may be configured to receive second configuration data via the first subchannel C/A information provided on the C/A bus, and may update the one or more parameters of the register clock driver circuit 312 based on the second configuration data. The control plane hub 316 may include a chip, device, circuit, etc. In some examples, the control plane hub 316 may include an electrically-erasable programmable read-only memory (EEPROM) configured to store the configuration data, in some examples.

Figure 4:
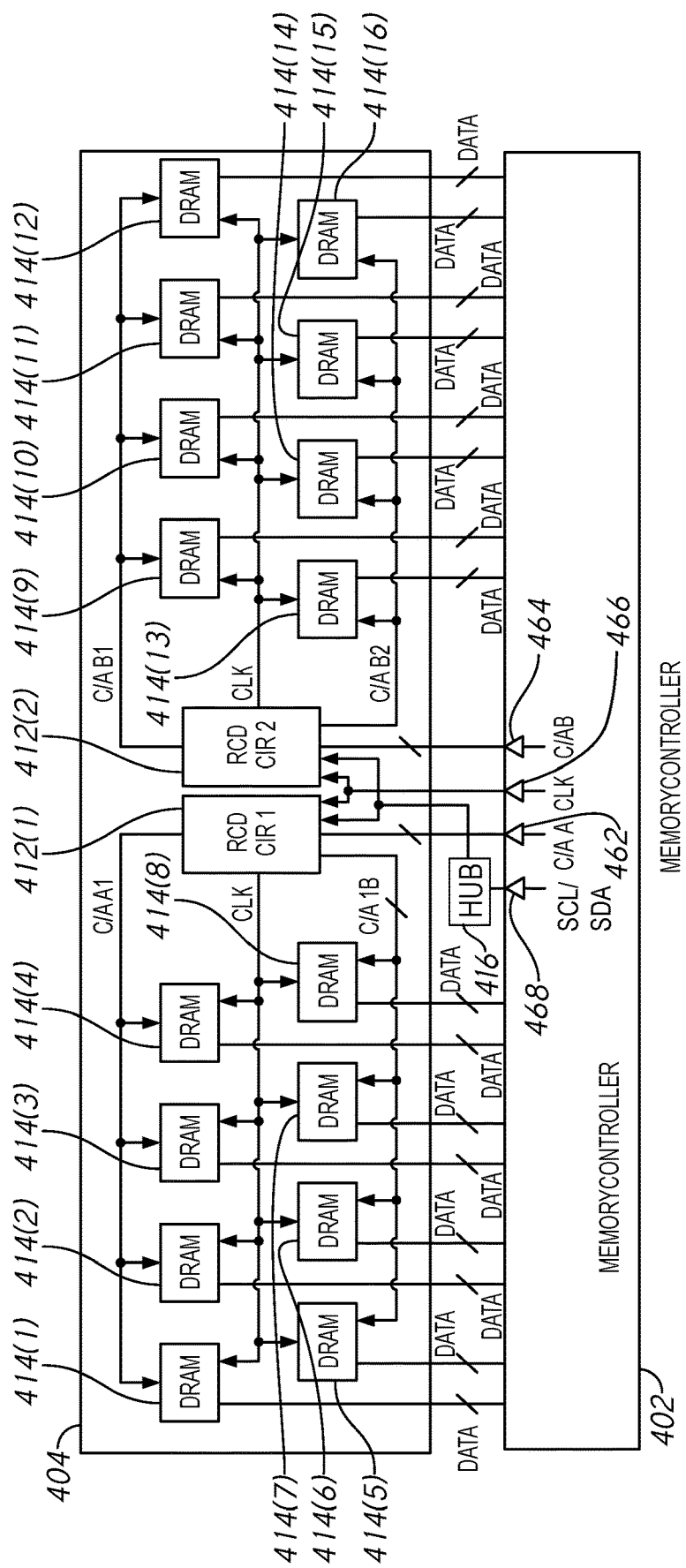
FIG. 4 is a block diagram of a memory system including a memory subsystem coupled to a memory controller according to an embodiment of the present disclosure.

FIG. 4 is a block diagram of a memory system 400 including a memory subsystem 404 coupled to a memory controller 402 according to an embodiment of the present disclosure. The memory subsystem 404 may include a memory module, such as a DIMM (e.g., a registered DIMM, a load reduction DIMM (LRDIMM), a micro DIMM, a NVDIMM, or any other type of DIMM). In some examples, the memory subsystem 404 may include a soldered memory subsystem other than a memory module and/or a DIMM. The memory subsystem 104 of FIG. 1 and/or the memory subsystem 204 of FIG. 2 may implement the memory subsystem 404, in some examples.

The memory subsystem 404 may be configured to communicate with a memory controller 402 to receive and store configuration data via a SCL/SDA bus. The SCL/SDA bus may include a SMBus or an $I^2C$ bus, in some examples. The configuration data may include configuration data pertaining to operation of the memory subsystem 404, such as timing parameters, addressing parameters, power levels, receiver and transmitter component coefficients, etc., or any combination thereof. The memory subsystem 404 may also be configured to communicate with a memory controller 402 to perform memory access operations based on a clock signal CLK, first subchannel C/A information from a C/A/ A bus, second subchannel C/A information from a C/A/ B bus, and/or data transferred via signals over respective data buses. In some examples, the memory controller 402 may include a SCL/SDA driver 468 configured to drive the configuration data to the SCL/SDA bus, a C/A A bus driver 462 configured to drive first subchannel C/A information to a C/A/ A bus, a C/A B bus driver 464 configured to drive second subchannel C/A information to a C/A/ B bus, and a clock driver 466 configured to drive the CLK signal over the clock signal line. The memory controller 402 may further include drivers and receivers (not shown) coupled to the respective data buses to provide write data and to receive read data, respectively.

The memory subsystem 404 may include a control plane hub 416, memories 414(1)-(16), register clock driver circuit 412(1) and register clock driver circuit 412(2). The control plane hub 416 may be configured to receive and store the configuration data from the memory controller via the SCL/SDA bus and to provide control plane communication to facilitate provision of the configuration data to components of the memory subsystem 404. The control plane hub 416 may provide the configuration data to the memories 414(1)-(16), the register clock driver circuit 412(1), and/or the register clock driver circuit 412(2) during operation. The control plane hub 416 may include a chip, device, circuit, etc. In some examples, the control plane hub 416 may include an electrically-erasable programmable read-only memory (EEPROM) configured to store the configuration data, in some examples.

The memories 414(1)-(8) may be coupled to register clock driver circuit 412(1) and the memories 414(9)-(16) may be coupled to the register clock driver circuit 412(2). The register clock driver circuit 412(1) and the register clock driver circuit 412(2) may be configured to receive configuration data from the control plane hub 416 to set one or more configurable parameters for operation. The one or more configurable parameters may include timing parameters, power levels, addressing parameters, receiver and transmitter component coefficients (e.g., DFE or FFE coefficients), etc., or any combination thereof.

The register clock driver circuit 412(1) may also be configured to receive first subchannel C/A information from the C/A A bus and the CLK signal and the register clock driver circuit 412(2) may also be configured to receive second subchannel C/A information from the C/A B bus and the CLK signal. The first and second subchannel C/A information may correspond to C/A information for a single channel. The first subchannel C/A information and the second subchannel C/A information may include memory access commands and addresses, chip select signals, etc., corresponding to first and second subchannels, respectively. The first and/or second subchannel C/A information may also include information to configure the memory subsystem 404 and/or components of the memory subsystem 404. The register clock driver circuit 412(1) may provide the first subchannel C/A information to each of C/A A1-A2 buses in parallel responsive to the CLK signal and the register clock driver circuit 412(2) may provide the second subchannel C/A information to each of C/A B1-B2 buses in parallel responsive to the CLK signal. It is appreciated that the memory subsystem 404 of FIG. 4 may include a dual side memory subsystem, where an opposite side (not shown) of the memory subsystem 404 includes additional memories arranged similar to the memories 414(0)-(15) and that the register clock driver circuit 412(1) and the register clock driver circuit 412(2) may provide the first and second subchannel C/A information, respectively, on additional C/A A3-A4 buses and C/A B3-B4 buses, respectively, without departing from the scope of the disclosure.

In some examples, the first subchannel C/A information may also include information to configure components of the register clock driver circuit 412(1). For example, the first subchannel C/A information may include second configuration data to set the one or more configurable parameters of the register clock driver circuit 412(1).

In some examples, the memories 414(1)-(16) may all be the same type of memory. In other examples, the memories 414(1)-(16) may be a mix of different types of memories. In some examples, the memories 414(1)-(16) may implement in the memories 114(1) and/or the memories 114(2) of FIG. 1, the memories 214(1) and/or the memories 214(2) of FIG. 1, the memory 314 and/or one or more of the memory die 360 of FIG. 3A, the memory 315 and/or one or more of the memory die 360 of FIG. 3B, or any combination thereof. Although the memory module 404 shown in FIG. 4 having 16 memories 414(1)-(16), more or fewer memories may be used in other embodiments. In some examples, the memory subsystem 404 may include an additional memory (not shown) that is used for error correcting code (ECC) storage. Each of the memories 414(1)-(16) may include one or more memory devices, packages, and/or memory die. In some examples, the one or more memory devices or packages may each include one or more memory die stacks. The memories 414(1)-(16) may include DRAM architecture, such as DDR4 DRAM, DDR5 DRAM, DDR6 DRAM, etc.

Each of the memories 414(1)-(4) may be coupled to the C/A A1 bus and each of the memories 414(5)-(8) may be coupled to the C/A A2 bus to receive first subchannel C/A information. Each of the memories 414(9)-(12) may be coupled to the C/A B1 bus and each of the memories 414(13)-(16) may be coupled to the C/A B2 bus to receive second subchannel C/A information. Each of the memories 414(1)-(16) may also be coupled to a respective data bus to receive write data from and to provide read data to the memory controller 202 responsive to the first subchannel C/A information or the second subchannel C/A information.

In some embodiments, the memories 414(1)-(16) may be organized into different physical ranks and/or may be included on one or both sides of the memory subsystem 404. In some embodiments, there may be 4, 8, 16, or more memories per physical rank, and one or more physical ranks in the memory subsystem 404. For example, the memory subsystem 404 may include a first physical rank on a first side of the memory subsystem 404 (e.g., the 16 memories 414(1)-(16)), and a second physical rank on a back side of the memory subsystem 404 (e.g., 16 more memories on a reverse side of the memory subsystem 404).

In operation, for a given communication channel, the C/A A bus driver 462 and the C/A B bus driver 464 of the 402 may contemporaneously provide respective first and second subchannel C/A information over two independent subchannels via the C/A A bus and C/A B bus, respectively, along with a clock driver 466 to provide a single clock signal over a clock signal line that is used to synchronize timing of the two subchannels to the memory subsystem 404.

In some examples, the memory subsystem 404 may further include the control plane hub 416 that is configured to receive and store configuration data from the memory controller 402 via the SCL/SDA bus and to provide control plane communication to facilitate provision of the configuration data to components (e.g., thermal sensors, power management integrated circuits, etc.) of the memory subsystem 404 and/or memories 414(1)-(16) and the register clock driver circuits 412(1) and 412(2). The configuration data may include configuration data pertaining to operation of the memory subsystem 404, including the memories 414(1)-(16) and the register clock driver circuits 412(1) and 412(2), such as timing parameters, addressing parameters, receiver and transmitter component coefficients, modes of operation, etc., or any combination thereof. The control plane hub 416 may provide the configuration data may be to the memories 414(1)-(16) and the register clock driver circuits 412(1) and 412(2) during operation and/or during initialization.

Specifically, the control plane hub 416 may be configured to provide at least some of the configuration data to the register clock driver circuit 412(1) and the register clock driver circuit 412(2) contemporaneously. The configuration data may be used to configure one or more parameters of the register clock driver circuit 412(1) and the register clock driver circuit 412(2), such as timing parameters, addressing parameters, receiver and transmitter component coefficients, modes of operation, etc., or any combination thereof. In some examples, the configuration data may be the same configuration data from the control plane hub 416. However, physical differences in the arrangement of each of the register clock driver circuit 412(1) and the register clock driver circuit 412(2) relative to the respective C/A A or B bus and to the respective memories 414(1)-(16), as well as process differences within each of the register clock driver circuit 412(1) and the register clock driver circuit 412(2) or the connected memories 414(1)-(16), may result in different configurations between the register clock driver circuit 412(1) and the register clock driver circuit 412(2). Thus, to accommodate different configurations, the register clock driver circuit 412(1) may be configured to receive second configuration data via the first subchannel C/A information, and may update the one or more parameters of the register clock driver circuit 412(1) based on the second configuration data.

The register clock driver circuit 412(1) and the register clock driver circuit 412(2) may each be configured to drive the first and second subchannel C/A information received from the C/A A bus and the C/A B bus, respectively, to the C/A A1-A2 buses and the C/A B1-B2 buses, respectively, responsive to the CLK signal. The CLK signal may be split (e.g., via clock tee) such that is routed to and received at the register clock driver circuit 412(1) and the register clock driver circuit 412(2) contemporaneously. The clock tee may be arranged (e.g., impedance matched, trace length and shape, etc.) to reduce likelihood of timing differences the register clock driver circuit 212(1) and the register clock driver circuit 212(2).

Each of the memories 414(1)-(4) may receive the first subchannel C/A information via the C/A A1 bus and each of the memories 414(5)-(8) may receive the first subchannel C/A information via the C/A A2 bus. One or more of the memories 414(1)-(8) may perform memory access operations responsive to the first subchannel C/A information to receive data from and provide data to the respective data buses in communication with the memory controller 402.

Each of the memories 414(9)-(12) may receive the second subchannel C/A information via the C/A B1 bus and each of the memories 414(13)-(16) may receive the second subchannel C/A information via the C/A B2 bus. One or more of the memories 414(9)-(16) may perform memory access operations responsive to the second subchannel C/A information to receive data from and provide data to the respective data buses in communication with the memory controller 402.

It is appreciated that, without departing from the scope of the disclosure, the memory subsystem 404 could be scaled to include more than 16 (or 32) memories, more than two register clock driver circuits, and/or more than two groups of memories, such as to support additional subchannels. It is also appreciated that each of the register clock driver circuit 412(1) and the register clock driver circuit 412(2) may be configured with additional driver circuits to support more than four independent C/A buses. An ability to support more than one register clock driver circuit on the memory subsystem 404 may increase a number of output drivers, which may, correspondingly provide support for an increased number of memories on the memory subsystem 404 as compared with single RCD device memory subsystem implementations.

Figure 5:
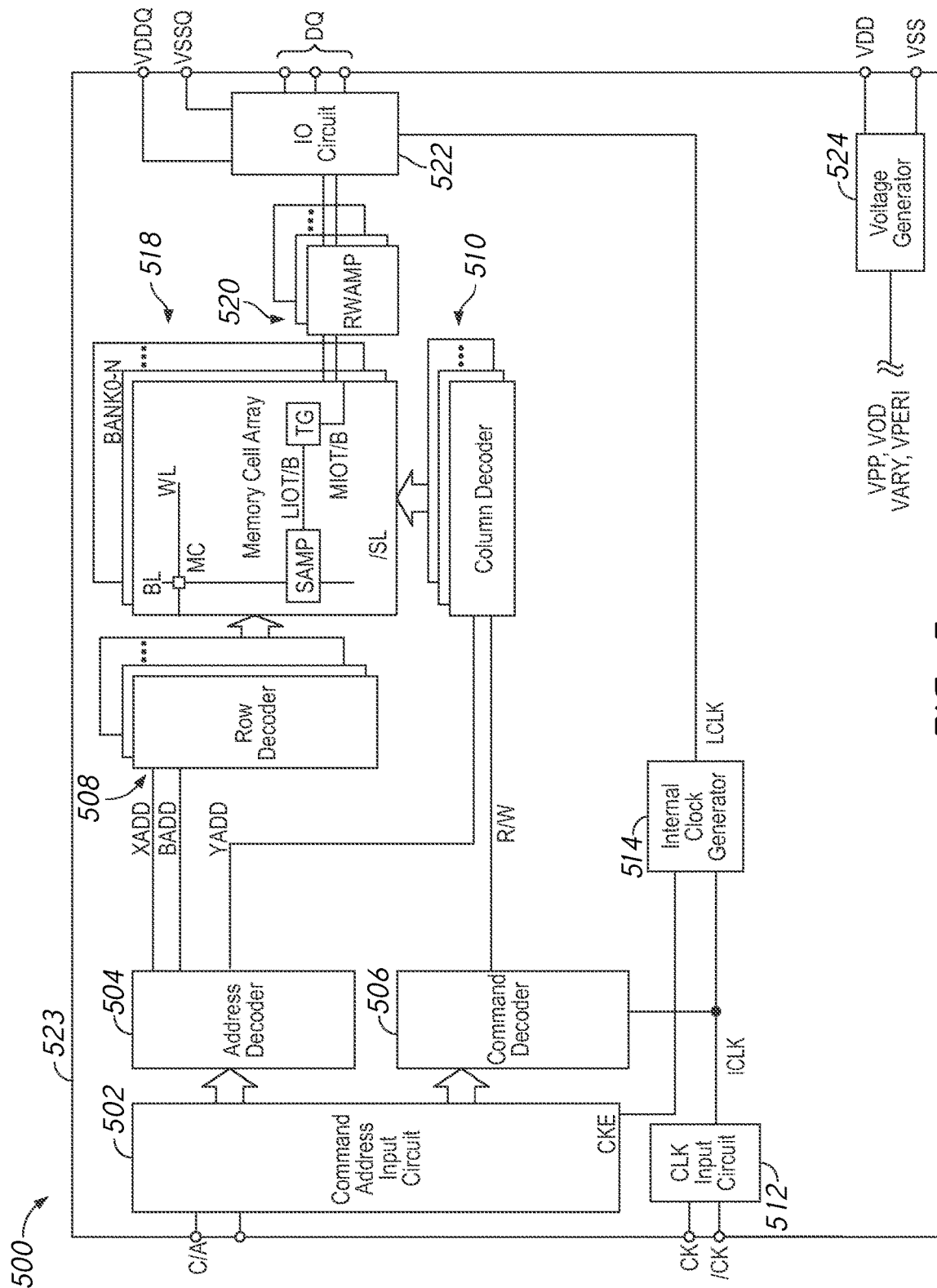
FIG. 5 is a block diagram of a semiconductor device according to an embodiment of the present disclosure.

FIG. 5 is a block diagram of a semiconductor device 500 according to at least one embodiment of the disclosure. The semiconductor device 500 may be a semiconductor memory device, such as DRAM device (e.g., double data rate (DDR) 4 DRAM, DDR5 DRAM, DDR6 DRAM, etc.) integrated on a single semiconductor chip. The example device 500 of FIG. 5 may include a memory package such as the stack of memory dies positioned on a substrate 523, which may function as (and may be referred to) as an interface. Although certain components are shown in the memory dies of the stack of memory dies, and certain components on the substrate 523, other arrangement of the components of the device 500 between the stack of memory dies and the substrate 523 are possible in other example embodiments. In some embodiments, the device 500 may include multiple stacks of memory dies. In other embodiments, the stack of memory dies may include a single memory die. The memory package 110(1) and/or the memory package 110(2) of FIG. 1, the memory package 210(1) and/or the memory package 210(2) of FIG. 2, the dual-stack memory package 310 and/or either or both of the die stack 342(1) and the die stack 342(2) of FIG. 3A, the single-stack memory package 311 and/or the die stack 343 of FIG. 3B, any of the memories register clock driver circuit 412(1)-(16) of FIG. 4, or any combination thereof, may implement the semiconductor device 500, in some examples.

For brevity and clarity of illustration, only the components of one memory die in the stack of memory dies are shown in FIG. 5. Generally, the different memory dies of the stack of memory dies may each have similar components to each other. In some embodiments, each memory die of the stack of memory dies may be physically identical to each other. The substrate 523 may act as an interface, and may send and receive information (e.g., data, commands) to and from the outside, while the memory dies in the stack of memory dies communicate with components of the substrate. As described herein, commands and other signals sent by the substrate 523 may be sent to all memory dies in the stack of memory dies or may be separately addressed to individual memory dies of the stack of memory dies.

The semiconductor device 500 includes a memory array 518. The memory array 518 may be positioned in a die of the stack of memory dies. The memory array 518 is shown as including a plurality of memory banks. In the embodiment of FIG. 5, the memory array 518 is shown as including N+1 memory banks BANK0-N, where N is any integer value, such as 2, 4, 8, 16, 32, etc. Each of the memory banks BANK0-N may include a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 508 and the selection of the bit lines BL and /BL is performed by a column decoder 510. The row and column decoders 508 and 510 may also be positioned in the memory dies of the stack of memory dies. In the embodiment of FIG. 5, the row decoder 508 includes a respective row decoder for each memory bank and the column decoder 510 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 520 over complementary local data lines (LIOT/B), transfer gate (TG), and complementary main data lines (MIOT/B). Conversely, write data outputted from the read/write amplifiers 520 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 500 may employ a plurality of external terminals that include command and address (C/A) terminals coupled to a command and address bus to receive commands and addresses, and a CS signal, clock terminals to receive clocks CK and /CK, data terminals DQ to receive and provide data (e.g., via a multi-channel data bus), and power supply terminals to receive power supply potentials VDD, VSS, VDDQ, and VSSQ. The external terminals may be positioned on the substrate 523.

The clock terminals are supplied with external clocks CK and /CK that are provided to an input circuit 514. The external clocks may be complementary. The input circuit 514 generates an internal clock ICLK based on the CK and /CK clocks. The ICLK clock is provided to the command decoder 510 and to an internal clock generator 512. The internal clock generator 512 provides various internal clocks LCLK based on the ICLK clock. The LCLK clocks may be used for timing operation of various internal circuits. The internal data clocks LCLK are provided to the input/output circuit 522 to time operation of circuits included in the input/output circuit 522, for example, to data receivers to time the receipt of write data.

The C/A terminals may be supplied with memory addresses. The memory addresses supplied to the C/A terminals are transferred, via a command/address input circuit 502, to an address decoder 504. The address decoder 504 receives the address and supplies a decoded row address XADD to the row decoder 508 and supplies a decoded column address YADD to the column decoder 510. The address decoder 504 may also supply a decoded bank address BADD, which may indicate the bank of the memory array 518 containing the decoded row address XADD and column address YADD. In some embodiments, the address decoder 504 may also indicate a particular memory die of the stack of memory dies for activation. The C/A terminals may be supplied with commands Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 506 via the command/address input circuit 502. The command decoder 506 includes circuits to decode the internal command signals to generate various internal signals and commands for performing operations. For example, the command decoder 506 may provide a row command signal to select a word line and a column command signal to select a bit line.

The semiconductor device 500 may receive an access command which is a read command. When a read command is received, and a bank address, a row address and a column address (and optional die address) are timely supplied with the read command, read data is read from memory cells in the memory array 518 corresponding to the row address and column address. The read command is received by the command decoder 506, which provides internal commands so that read data from the memory array 518 is provided to the read/write amplifiers 520. The read data is output to outside from the data terminals DQ via the input/output circuit 522.

The semiconductor device 500 may receive an access command which is a write command. When the write command is received, and a bank address, a row address and a column address (and optional die address) are timely supplied with the write command, write data supplied to the data terminals DQ is written to a memory cells in the memory array 518 corresponding to the row address and column address. The write command is received by the command decoder 506, which provides internal commands so that the write data is received by data receivers in the input/output circuit 522. Write clocks may also be provided to the external clock terminals for timing the receipt of the write data by the data receivers of the input/output circuit 522. The write data is supplied via the input/output circuit 522 to the read/write amplifiers 520, and by the read/write amplifiers 520 to the memory array 518 to be written into the memory cell MC.

The power supply terminals are supplied with power supply potentials VDD and VSS. The power supply potentials VDD and VSS are supplied to an internal voltage generator circuit 524. The internal voltage generator circuit 524 generates various internal potentials VPP, VOD, VARY, VPERI, and the like based on the power supply potentials VDD and VSS supplied to the power supply terminals. The internal potential VPP is mainly used in the row decoder 508, the internal potentials VOD and VARY are mainly used in the sense amplifiers SAMP included in the memory array 518, and the internal potential VPERI is used in many peripheral circuit blocks.

The power supply terminals are also supplied with power supply potentials VDDQ and VSSQ. The power supply potentials VDDQ and VSSQ are supplied to the input/output circuit 522. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 522 so that power supply noise generated by the input/output circuit 522 does not propagate to the other circuit blocks.

Figure 6:
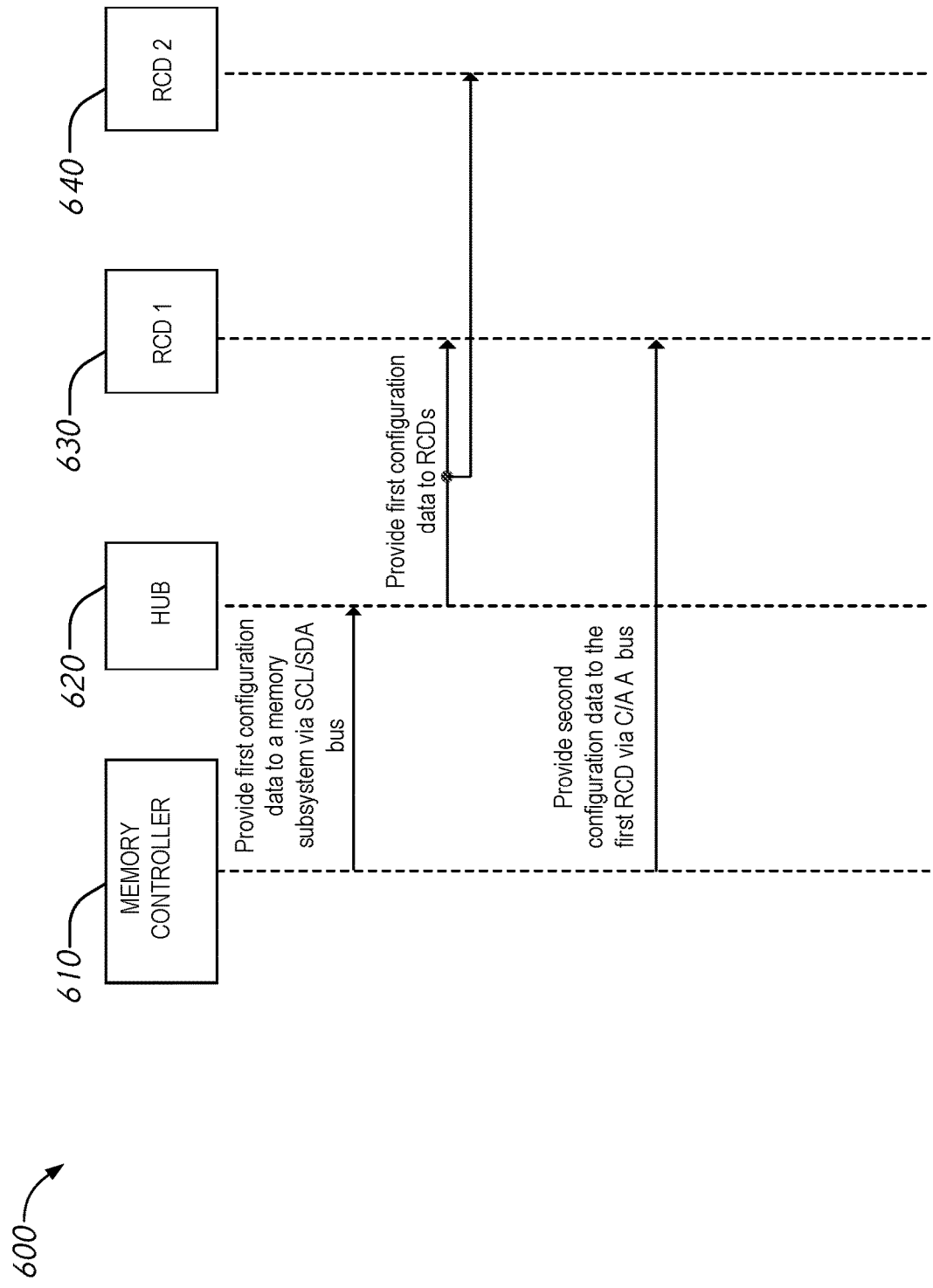
FIG. 6 is a sequence diagram for configuring dual register clock drivers of a memory subsystem according to an embodiment of the present disclosure.

FIG. 6 is a sequence diagram 600 for configuring dual register clock driver circuits of a memory subsystem according to an embodiment of the present disclosure. The sequence diagram 600 may be performed by a memory controller 610, a control plane hub 620, a first register clock driver circuit 630, and a second register clock driver circuit 640. The control plane hub 620, the first register clock driver circuit 630, and the second register clock driver circuit 640 may be included as part of a single memory subsystem, such as the memory subsystem 104 of FIG. 1, the memory subsystem 204 of FIG. 2, the memory subsystem 404 of FIG. 4, or any combination thereof. The memory controller 610 may include the memory controller of the memory system of FIG. 1, the memory controller 202 of FIG. 2, the memory controller 402 of FIG. 4, or any combination thereof. The control plane hub 620 may include the control plane hub 116 of FIG. 1, the control plane hub 216 of FIG. 2, the control plane hub 316 of FIGS. 3A and/or 3B, the control plane hub 416 of FIG. 4, or any combination thereof. The first register clock driver circuit 630 may include the register clock driver 112(1) of FIG. 1, the register clock driver 212(1) of FIG. 2, the register clock driver 312 of FIGS. 3A and/or 3B, the register clock driver 412(1) of FIG. 4, or any combination thereof. The second register clock driver circuit 640 may include the register clock driver 112(2) of FIG. 1, the register clock driver 212(2) of FIG. 2, the register clock driver 312 of FIGS. 3A and/or 3B, the register clock driver 412(2) of FIG. 4, or any combination thereof.

As shown in the sequence diagram 600, the memory controller 610 may be configured to provide first configuration data to the control plane hub 620 via a SCL/SDA bus. The control plane hub 620 may be configured to receive and store the configuration data. The SCL/SDA bus may include a SMBus or an I²C bus, in some examples. The configuration data may include configuration data pertaining to operation of the first register clock driver circuit 630 and the second register clock driver circuit 640, such as timing parameters, addressing parameters, power levels, receiver and transmitter component coefficients, etc., or any combination thereof.

The control plane hub 620 may be configured to provide the first configuration data to the first register clock driver circuit 630 and to the second register clock driver circuit 640 contemporaneously. The configuration data may be used to configure one or more parameters of the register clock driver circuit 112(1) and the register clock driver circuit 112(2), such as timing parameters, addressing parameters, receiver and transmitter component coefficients, modes of operation, etc., or any combination thereof.

However, physical differences in the arrangement of each of the first register clock driver circuit 630 and the second register clock driver circuit 640 relative to the respective C/A A or B bus and to the respective memories (not shown), as well as process differences within each of the first register clock driver circuit 630 and the second register clock driver circuit 640 or the connected memories, may result in different configurations between the first register clock driver circuit 630 and the second register clock driver circuit 640. Thus, to accommodate different configurations, the first register clock driver circuit 630 may be configured to receive second configuration data in the first subchannel C/A information from the memory controller 610 via the C/A A bus, and may update the one or more parameters of the first register clock driver circuit 630 based on the second configuration data.

FIG. 7 is a flow diagram of a method 700 for configuring dual register clock drivers of a memory subsystem according to an embodiment of the present disclosure. The method 700 may be performed, at least in part, by the memory subsystem 104 of FIG. 1, the memory subsystem 204 of FIG. 2, the dual-stack memory package 310 of FIG. 3A, the single-stack memory package 311 of FIG. 3B, the memory subsystem 404 of FIG. 4, or any combination thereof.

The method 700 may include receiving, at a control plane hub of a memory subsystem, first configuration data from a memory controller via a first bus, at 710. The control plane hub may include the control plane hub 116 of FIG. 1, the control plane hub 216 of FIG. 2, the control plane hub 316 of FIGS. 3A and 3B, the control plane hub 416 of FIG. 4, the control plane hub 620 of FIG. 6, or any combination thereof. The memory controller may include the memory controller of FIG. 1, the memory controller 202 of FIG. 2, the memory controller 402 of FIG. 4, the memory controller 610 of FIG. 6, or any combination thereof. The configuration data may be used to configure one or more parameters of the memory subsystem, such as timing parameters, addressing parameters, receiver and transmitter component coefficients, modes of operation, etc., or any combination thereof. The first bus may include the SCL/SDA of any of FIGS. 1-4.

The method 700 may include providing the first configuration data to a first register clock driver and to a second register clock driver of the memory subsystem, at 720. The first register clock driver and the second register clock driver may each set a respective configuration parameter to a first value based on the first configuration data The first and/or second register clock drivers may include the register clock driver circuit 112(1) and/or the register clock driver circuit 112(2) of FIG. 1, the register clock driver circuit 212(1) and/or the register clock driver circuit 212(2) of FIG. 2, the register clock driver circuit 312 of FIGS. 3A and 3B, the register clock driver circuit 412(1) and/or the register clock driver circuit 412(2) of FIG. 4, the first register clock driver circuit 630 and/or the second register clock driver circuit 640 of FIG. 6, or any combination thereof. The respective configuration parameter of each of the first register clock driver and the second clock driver includes at least one of a timing parameter, an addressing parameter, a receiver or transmitter component coefficient, or a mode of operation. In some examples, the method 700 may include setting, by the first register clock driver, the respective configuration parameter to the first value in response to the first configuration data. In some examples, the method 700 may further include setting, by the second register clock driver, the respective configuration parameter to the first value in response to the first configuration data.

The method 700 may include receiving, at the first register clock driver, second configuration data from the memory controller via a second bus, at 730. The first register clock driver sets the respective configuration parameter to a second value based on the second configuration data. In some examples, the method 700 may include setting, by the first register clock driver, the respective configuration parameter to the second value in response to the second configuration data.

In some examples, the method 700 may include decoding, via the first register clock driver, first subchannel command and address information of a channel received from the memory controller via a first command and address bus based on the respective configuration parameter having the second value, and providing the decoded first subchannel command and address information to a first group of memories. In some examples, the method 700 may further include decoding, via the second register clock driver, second subchannel command and address information of the channel received from the memory controller via a second command and address bus based on the respective configuration parameter having the first value, and providing the decoded second subchannel command and address information to a second group of memories.

The second and third buses may include the C/A A and/or the C/A B buses of FIG. 1, the C/A A and/or the C/A B buses of FIG. 2, the C/A bus of FIGS. 3A and 3B, the C/A A and/or the C/A B buses signal of FIG. 4, or any combination thereof. The first group of memories and/or the second group of memories may include the memories 114(1) and/or the memories 114(2) of FIG. 1, the memories 114(1) and/or memories 114(2) of FIG. 1, the memory 314 of FIG. 3A, the memory 315 of FIG. 3B, the memories 414(1)-(16) of FIG. 4, or any combination thereof. In some examples, the first subchannel command and address information may be provided to the first group of memories via a first plurality of internal command and address buses and the second subchannel command and address information may be provided to the second group of memories via a second plurality of internal command and address buses. The first plurality of internal command and address buses may include the C/A A1-A4 buses of FIG. 1, the C/A A1-A4 buses of FIG. 2, the C/A bus of FIGS. 3A and 3B, the C/A A1-A2 (and A3-A4—not shown) of FIG. 4, or any combination thereof. The second plurality of internal command and address buses may include the C/A B1-B4 buses of FIG. 1, the C/A B1-B4 buses of FIG. 2, the C/A bus of FIGS. 3A and 3B, the C/A B1-B2 (and B3-B4—not shown) of FIG. 4, or any combination thereof. The first and second groups of memories include DRAM, (e.g., DDR4, DDR5, DDR6, etc.). In some examples, provision of the first subchannel command and address information to the first plurality of internal command and address buses is contemporaneous with provision of the subchannel command and address information to the second plurality of internal command and address buses.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

The foregoing description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a first register clock driver configured to receive first configuration data in first subchannel command and address information corresponding to a channel from a memory controller via a first command and address bus, wherein the first register clock driver is further configured to receive second configuration data, wherein the first register clock driver is configured to update parameters set by the second configuration data with updates provided via the first configuration data;
   a second register clock driver configured to receive second subchannel command and address information corresponding to the channel from the memory controller via a second command and address bus, wherein the second register clock driver is further configured to receive the second configuration data; and
   a control plane hub configured to receive the second configuration data from a memory controller via a serial data bus and to provide the second configuration data to the first register clock driver and to the second register clock driver.

2. The apparatus of claim 1, wherein the control plane hub is configured to provide the second configuration data to the first register clock driver and to the second register clock driver contemporaneously.

3. The apparatus of claim 1, wherein the first configuration data and the second configuration data each include at least one of a timing parameter, an addressing parameter, a receiver or transmitter component coefficient, or a mode of operation, or any combination thereof.

4. The apparatus of claim 1, wherein a first configuration parameter of the first register clock driver and a first configuration parameter of the second register clock driver each include at least one of a timing parameter, an addressing parameter, a receiver or transmitter component coefficient, or a mode of operation.

5. The apparatus of claim 4, wherein the first configuration parameter of the first register clock driver and the first configuration parameter of the second register clock driver are a same type of parameter.

6. The apparatus of claim 4, wherein the first register clock driver is configured to receive or transmit the first command and address information based on the first configuration parameter of the first register clock driver having a second value and the second register clock driver is configured to receive or transmit the second command and address information based on the first configuration parameter of the second register clock driver having a first value.

7. The apparatus of claim 1, wherein the first register clock driver is a first semiconductor device and the second register clock driver is a second semiconductor device.

8. The apparatus of claim 1, wherein operation of the first register clock driver is synchronous with operation of the second register clock driver.

9. The apparatus of claim 1, wherein the first register clock driver is configured to provide the first subchannel command and address information to a first group of memories via a first internal command and address bus and the second register clock driver is configured to provide the second subchannel command and address information to a second group of memories via a second internal command and address bus.

10. The apparatus of claim 1, wherein the first register clock driver is configured to set a first configuration parameter to a first value based on the first configuration data, wherein the first register clock driver is further configured to receive the second configuration data in the first subchannel command and address information via the first command and address bus and to set the first configuration parameter to a second value based on the second configuration data, and wherein the second register clock driver is configured to set a first configuration parameter to the first value based on the first configuration data.

11. A memory subsystem comprising:
    a first memory package including a first register clock driver configured to receive first subchannel command and address information corresponding to a channel via a first bus based on a configuration defined by first configuration data received via the first bus or second configuration data,
    a second memory package including a second register clock driver configured to receive second subchannel command and address information corresponding to the channel via a second bus based on a configuration defined by the second configuration data; and
    a control plane hub configured to receive the second configuration data from a memory controller via a third bus and to provide the second configuration data to the first register clock driver and to the second register clock driver.

12. The memory subsystem of claim 11, wherein the first memory package includes a first group of memories configured to perform a memory access operation in response to the first subchannel command and address information from the first register clock driver via one of a first plurality of internal command and address buses, wherein the second memory package includes a second group of memories configured to perform a memory access operation in response to the second subchannel command and address information from the second register clock driver via one of a second plurality of internal command and address buses.

13. The memory subsystem of claim 11, wherein the first register clock driver is included in a first semiconductor device and the second register clock driver is included in a second semiconductor device.

14. The memory subsystem of claim 11, wherein the first bus is a first command and address bus, the second is a second command and addresses bus, and the third bus is a serial data bus.

15. The memory subsystem of claim 11, wherein the first register clock driver is configured to decode the first subchannel command and address information based on a configuration parameter of the first register clock driver having the second value and the second register clock driver is configured to decode the second subchannel command and address information based on a configuration parameter of the second register clock driver having the first value.

16. The memory subsystem of claim 11, wherein the first register clock driver is configured to set a configuration parameter to a first value based on the second configuration data and to set the first configuration parameter to a second value based on the first configuration data received in the first subchannel command and address information via the first bus, and wherein the second register clock driver is configured to set a configuration parameter to the first value based on the second configuration data.

17. A method comprising:
receiving, at a control plane hub of a memory subsystem, first configuration data from a memory controller via a first bus;
providing the first configuration data to a first register clock driver and to a second register clock driver of the memory subsystem, wherein the first register clock driver and the second register clock driver each set a respective configuration parameter to a first value based on the first configuration data; and
receiving, at the first register clock driver, second configuration data from the memory controller via a second bus, wherein the first register clock driver sets the respective configuration parameter to a second value based on the second configuration data.

18. The method of claim 17, further comprising:
setting, by the first register clock driver, the respective configuration parameter to the first value in response to the first configuration data; and
setting, by the first register clock driver, the respective configuration parameter to the second value in response to the second configuration data.

19. The method of claim 18, further comprising setting, by the second register clock driver, the respective configuration parameter to the first value in response to the first configuration data.

20. The method of claim 17, wherein the respective configuration parameter of each of the first register clock driver and the second clock driver includes at least one of a timing parameter, an addressing parameter, a receiver or transmitter component coefficient, or a mode of operation.

21. The method of claim 17, further comprising:
decoding, via the first register clock driver, first subchannel command and address information of a channel received from the memory controller via the second bus based on the respective configuration parameter having the second value;
providing the decoded first subchannel command and address information to a first group of memories; and
decoding, via the second register clock driver, second subchannel command and address information of the channel received from the memory controller via a third bus based on the respective configuration parameter having the first value; and
providing the decoded second subchannel command and address information to a second group of memories.

22. The method of claim 21, wherein the first and second groups of memories include dynamic, random-access memories.

* * * * *